(12) United States Patent
Lau et al.

(10) Patent No.: US 10,636,687 B2
(45) Date of Patent: Apr. 28, 2020

(54) APPARATUS FOR TRANSPORTATION OF A SUBSTRATE CARRIER IN A VACUUM CHAMBER, SYSTEM FOR VACUUM PROCESSING OF A SUBSTRATE, AND METHOD FOR TRANSPORTATION OF A SUBSTRATE CARRIER IN A VACUUM CHAMBER

(71) Applicants: Applied Materials, Inc., Santa Clara, CA (US); Simon Lau, Alzenau (DE); Wolfgang Buschbeck, Hanau (DE)

(72) Inventors: Simon Lau, Alzenau (DE); Wolfgang Buschbeck, Hanau (DE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/062,596

(22) PCT Filed: Jan. 18, 2016

(86) PCT No.: PCT/EP2016/050908
§ 371 (c)(1),
(2) Date: Jun. 14, 2018

(87) PCT Pub. No.: WO2017/125123
PCT Pub. Date: Jul. 27, 2017

(65) Prior Publication Data
US 2019/0006216 A1    Jan. 3, 2019

(51) Int. Cl.
*B65G 35/00*    (2006.01)
*C23C 14/50*    (2006.01)
(Continued)

(52) U.S. Cl.
CPC ...... *H01L 21/67709* (2013.01); *C23C 14/351* (2013.01); *C23C 14/50* (2013.01);
(Continued)

(58) Field of Classification Search
CPC ..... C23C 14/351; C23C 14/50; C23C 14/568; H01L 21/67709; H01L 21/67715; H01L 21/6776; B65G 35/00
(Continued)

(56) References Cited

U.S. PATENT DOCUMENTS

| 4,624,617 A | * | 11/1986 | Belna | B65G 54/02 |
| | | | | 104/282 |
| 5,906,262 A | * | 5/1999 | Miki | B65G 54/02 |
| | | | | 198/341.02 |

(Continued)

FOREIGN PATENT DOCUMENTS

KR    20150053966 A    5/2015

OTHER PUBLICATIONS

International Search Report and Written Opinion dated Oct. 11, 2016 for Application No. PCT/EP2016/050908.
(Continued)

*Primary Examiner* — Douglas A Hess
(74) *Attorney, Agent, or Firm* — Patterson + Sheridan, LLP

(57) ABSTRACT

An apparatus for transportation of a substrate carrier in a vacuum chamber is provided. The apparatus includes a first track providing a first transportation path for the substrate carrier, and a transfer device configured for contactlessly moving the substrate carrier from a first position on the first track to one or more second positions away from the first track. The one or more second positions include at least one of a position on a second track and a process position for processing of a substrate. The transfer device includes at least one first magnet device configured to provide a magnetic force acting on the substrate carrier to contactlessly move the substrate carrier from the first position to the one or more second positions.

20 Claims, 9 Drawing Sheets

(51) Int. Cl.
  *H01L 21/677* (2006.01)
  *C23C 14/35* (2006.01)
  *C23C 14/56* (2006.01)

(52) U.S. Cl.
  CPC ........ *C23C 14/568* (2013.01); *H01L 21/6776* (2013.01); *H01L 21/67715* (2013.01)

(58) Field of Classification Search
  USPC .................................................. 198/619, 805
  See application file for complete search history.

(56) References Cited

U.S. PATENT DOCUMENTS

| | | | | |
|---|---|---|---|---|
| 6,361,268 | B1 * | 3/2002 | Pelrine | B65G 54/02 |
| | | | | 104/284 |
| 7,959,395 | B2 * | 6/2011 | Hofmeister | H01L 21/67161 |
| | | | | 414/217 |
| 8,528,717 | B2 * | 9/2013 | Ando | B41F 17/005 |
| | | | | 198/306 |
| 8,602,706 | B2 * | 12/2013 | Hofmeister | H01L 21/67742 |
| | | | | 198/619 |
| 8,827,617 | B2 * | 9/2014 | Hofmeister | H01L 21/67161 |
| | | | | 156/345.31 |
| 9,027,739 | B2 * | 5/2015 | Hosek | F16D 3/00 |
| | | | | 198/619 |
| 9,246,377 | B2 * | 1/2016 | Fukasawa | H01L 21/67709 |
| 9,534,288 | B2 * | 1/2017 | Choi | C23C 14/042 |
| 9,624,580 | B2 * | 4/2017 | Choi | C23C 14/042 |
| 9,777,364 | B2 * | 10/2017 | Chang | C23C 14/12 |
| 2015/0188399 | A1 | 7/2015 | Fukasawa et al. | |
| 2015/0303090 | A1 | 10/2015 | Lindenberg | |

OTHER PUBLICATIONS

Korean Application No. 20187023825, Office Action dated Aug. 1, 2020, 9 pages.

* cited by examiner

APPARATUS FOR TRANSPORTATION OF A SUBSTRATE CARRIER IN A VACUUM CHAMBER, SYSTEM FOR VACUUM PROCESSING OF A SUBSTRATE, AND METHOD FOR TRANSPORTATION OF A SUBSTRATE CARRIER IN A VACUUM CHAMBER

FIELD

Embodiments of the present disclosure relate to an apparatus for transportation of a substrate carrier in a vacuum chamber, a system for vacuum processing of a substrate, and a method for transportation of a substrate carrier in a vacuum chamber. Embodiments of the present disclosure particularly relate to a sputter deposition apparatus and a method for a track change of a substrate carrier.

BACKGROUND

Techniques for layer deposition on a substrate include, for example, sputter deposition, thermal evaporation, and chemical vapor deposition (CVD). A sputter deposition process can be used to deposit a material layer on the substrate, such as a layer of an insulating material. Substrate carriers can be used for supporting the substrate during transportation of the substrate in a processing system. In order to deposit a multiple layer stack, an in-line arrangement of processing modules can be used. An in-line processing system includes a number of subsequent processing modules, such as deposition modules and optionally further processing modules, e.g., cleaning modules and/or etching modules, wherein processing aspects are conducted in one processing module after the other such that a plurality of substrates can continuously or quasi-continuously be processed with the in-line processing system.

Substrate carriers can be transported in the in-line processing system using a transportation system configured for conveying the substrate carrier having the substrate position thereon along one or more transportation paths. At least two transportation paths can be provided so that a first substrate carrier having a first substrate positioned thereon may overtake a second substrate on a second substrate carrier, for example, when the second substrate is being coated. The transportation system can have rollers configured to support and convey the substrate carriers, for example, along the transportation paths and/or from one transportation path to another transportation path (track change). The transportation generates particles that affect the vacuum conditions inside the in-line processing system. The particles can contaminate the layers deposited on the substrates, and a quality of the deposited layers can be reduced.

In view of the above, there is a need for new apparatuses for transportation of a substrate carrier in a vacuum chamber, systems for vacuum processing of a substrate, and methods for transportation of a substrate carrier in a vacuum chamber that reduce or even avoid a particle generation inside of the vacuum chamber. There is also a need for new apparatuses, systems and methods that provide a facilitated track change between at least two tracks in a vacuum chamber.

SUMMARY

In light of the above, an apparatus for transportation of a substrate carrier in a vacuum chamber, a system for vacuum processing of a substrate, and a method for transportation of a substrate carrier in a vacuum chamber are provided.

Further aspects, benefits, and features of the present disclosure are apparent from the claims, the description, and the accompanying drawings.

According to an aspect of the present disclosure, an apparatus for transportation of a substrate carrier in a vacuum chamber is provided. The apparatus includes a first track providing a first transportation path for the substrate carrier and a transfer device configured for contactlessly moving the substrate carrier from a first position on the first track to one or more second positions away from the first track. The one or more second positions include at least one of a position on a second track and a process position for processing of a substrate. The transfer device includes at least one first magnet device configured to provide a magnetic force acting on the substrate carrier to contactlessly move the substrate carrier from the first position to the one or more second positions.

According to another aspect of the present disclosure, a system for vacuum processing of a substrate is provided. The system includes a vacuum chamber and the apparatus for transportation of a substrate carrier according to the embodiments described herein. The system further includes one or more processing tools arranged along at least one of the first track and the second track, wherein the one or more processing tools are selected from the group consisting of sputter sources, surface treatment tools, heating devices, cleaning devices, etching tools, and any combination thereof.

According to yet another aspect of the present disclosure, a method for transportation of a substrate carrier in a vacuum chamber is provided. The method includes providing a repulsive magnetic force acting on the substrate carrier, and contactlessly moving the substrate carrier from a first position on a first track providing a first transportation path for the substrate carrier to a second position away from the first track, wherein the second position is at least one of a position on a second track and a process position for processing of a substrate.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The methods for operating the described apparatus include method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following.

DETAILED DESCRIPTION OF EMBODIMENTS

Figure 1A:
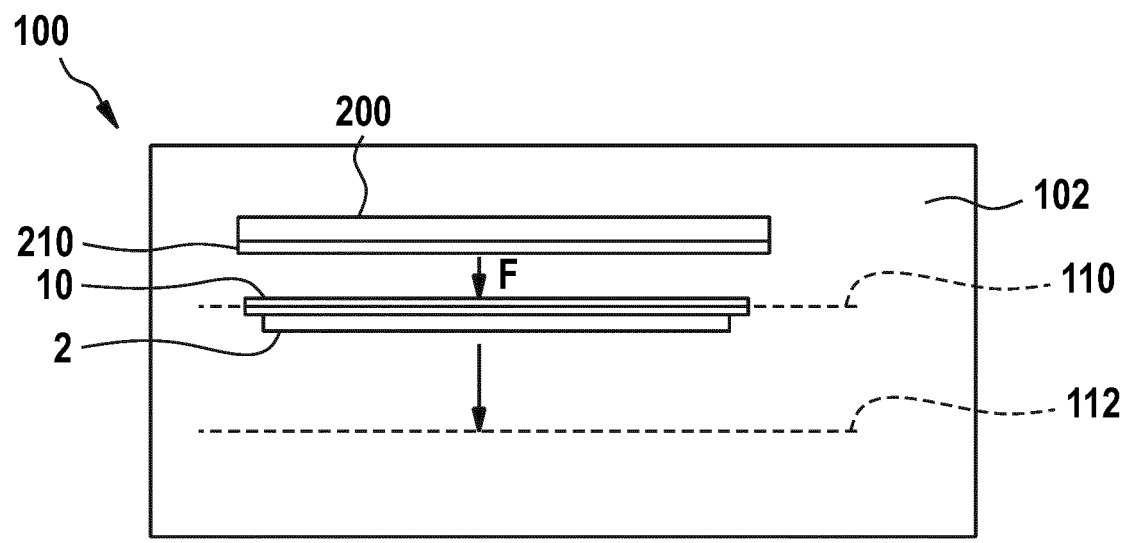
FIG. 1A shows a schematic view of an apparatus for transportation of a substrate carrier according to embodiments described herein.

Reference will now be made in detail to the various embodiments of the disclosure, one or more examples of which are illustrated in the figures. Within the following description of the drawings, the same reference numbers refer to same components. Generally, only the differences with respect to individual embodiments are described. Each example is provided by way of explanation of the disclosure and is not meant as a limitation of the disclosure. Further, features illustrated or described as part of one embodiment can be used on, or in conjunction with, other embodiments to yield yet a further embodiment. It is intended that the description includes such modifications and variations.

An apparatus for transportation of a substrate carrier in a vacuum chamber can provide one or more transportation paths, wherein the substrate carrier can be moved or conveyed along the one or more transportation paths. For example, the apparatus for transportation can be included in a processing system, such as in-line processing system, such that a substrate can continuously or quasi-continuously be processed. The apparatus of the present disclosure is configured to displace or move the substrate carrier away from one transportation path to another transportation path and/or a process position in which the substrate can be processed. Specifically, the apparatus can laterally displace the substrate carrier from a first position provided by a first track to a second position away from the first track. When the substrate carrier is moved from one track to another track, this can also be referred to as "track change".

The apparatus contactlessly moves the substrate carrier using a magnetic force, such as a repulsive (or repellent) and/or an attracting magnetic force. In other words, the apparatus does not use any mechanical force to move the substrate. Instead, the apparatus magnetically pushes or pulls the substrate carrier towards a new position. The terms "contactless" and "contactlessly moving" as used throughout the present disclosure can be understood in the sense that the substrate carrier is not moved using a mechanical contact between the substrate carrier and the apparatus, but is magnetically moved by a repulsive magnetic force. In some implementations, there can be no mechanical contact between the apparatus and the substrate carrier at all.

The contactless moving of the substrate carrier is beneficial in that a reduced number of particles or even no particles are generated due to a mechanical contact between the substrate carrier and sections of the apparatus, such as rollers, during the transport of the substrate carrier. Accordingly, vacuum conditions in the vacuum chamber are not affected by the moving of the substrate carrier. A purity of the layers deposited on the substrate can be improved, in particular since a particle generation is minimized or even avoided when using the contactless transportation.

Moreover, a track change between tracks in the vacuum chamber is facilitated, specifically since a repulsive magnetic force is provided for moving the substrate carrier. No mechanical means for engaging the substrate carrier to move the substrate carrier have to be provided. Further, a track change can be conducted by a single one-dimensional movement of the substrate carrier. No vertical lifting prior to the lateral displacement from one track to the other track has to be performed. The embodiments of the present disclosure allow for a simplified configuration of the apparatus for transportation of the substrate carrier. As an example, less movements and/or less drives for a track change are needed. Due to the simplified configuration, the apparatus for transportation of the substrate carrier has reduced manufacturing costs and maintenance costs.

FIGS. 1A and B show schematic views of an apparatus 100 for transportation of a substrate carrier 10 in a vacuum chamber 102 according to embodiments described herein. According to some embodiments, the apparatus 100 can be included in a system for vacuum processing, for example, a sputter deposition system.

Figure 1B:
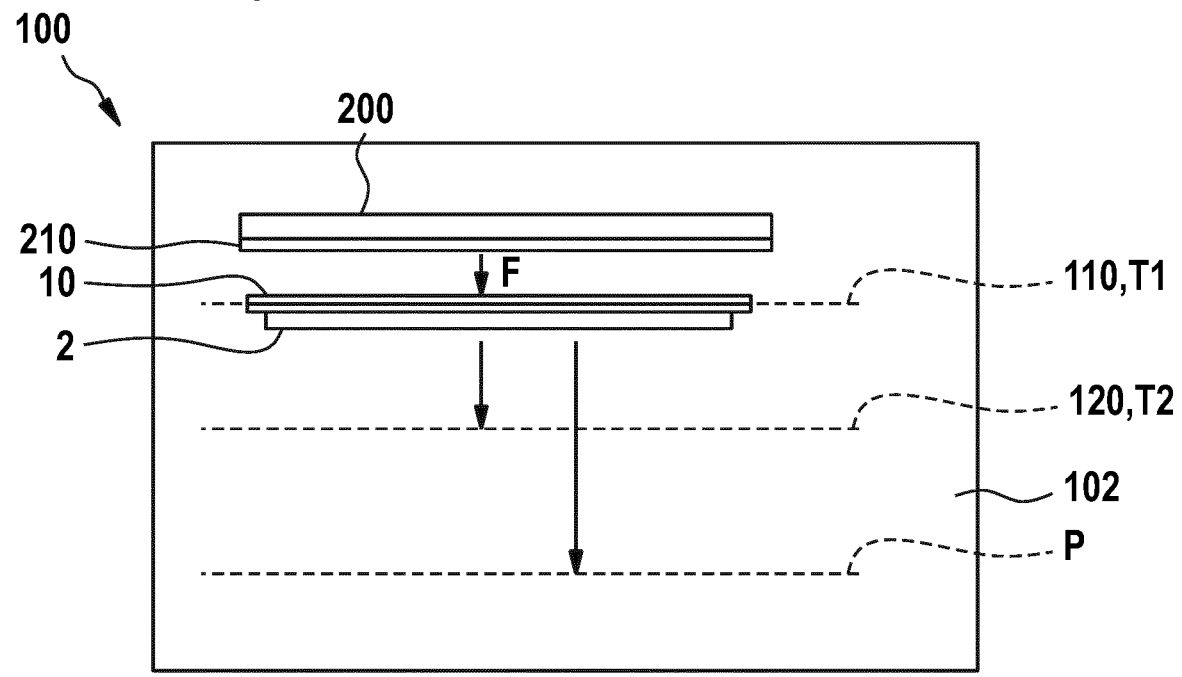
FIG. 1B shows a schematic view of an apparatus for transportation of a substrate carrier according to further embodiments described herein.

The apparatus 100 includes a first track 110 providing a first transportation path T1 for the substrate carrier 10 and a transfer device 200 configured for contactlessly moving the substrate carrier 10 from a first position on the first track 110 to one or more second positions away or spaced apart from the first track 110. The apparatus 100 shown in FIG. 1A has one second position 112. The apparatus 100 shown in FIG. 1B has two second positions. The one or more second positions include at least one of a position on a second track 120 and a process position P for processing of a substrate 2 supported on the substrate carrier 10. In some implementations, the second track 120 can provide a second transportation path T2 for the substrate carrier 10. According to some embodiments, the process position P can be provided on the second track 120. In another example, the process position P can be provided separately or remote from the first track 110 and/or the second track 120.

The transfer device 200 includes at least one first magnet device 210 configured to provide a magnetic force F acting on the substrate carrier 10 to contactlessly move the substrate carrier 10 from the first position to the one or more second positions, or vice versa. In some implementations, the at least one first magnet device 210 is configured to provide a repulsive (or repellent) magnetic force F acting on the substrate carrier 10 to push the substrate carrier 10 from the first position to the one or more second positions, or vice versa. Specifically, the at least one first magnet device 210 can provide a magnetic field acting on the substrate carrier 10 such that the magnetic force F resulting from the magnetic field pushes the substrate carrier 10 towards the new position of the substrate carrier 10. In some implementations, the transfer device 200 can push the substrate carrier 10 from the first track 110 to the second track 120 or to the process position P, as indicated with the arrows in FIG. 1B.

According to some embodiments, which can be combined with other embodiments described herein, the transfer device 200 is configured for contactlessly moving the substrate carrier 10 in a direction different from a direction (e.g., the transport direction 1) of the first transportation path T1 and/or the second transportation path T2, e.g., in a direction substantially perpendicular to the first transportation path T1 and/or the second transportation path T2. Specifically, moving the substrate carrier 10 away from the first track 110 can include a displacement, e.g., a lateral displacement, of the substrate carrier 10 in the direction perpendicular to the first transportation path T1 and/or perpendicular to a transport direction 1 of the substrate carrier 10. In some implementations, the transfer device 200 can push the substrate carrier 10 from the first track 110 to the second track 120 or to the process position P, as indicated with the arrows in FIG. 1B.

According to some embodiments, which can be combined with other embodiments described herein, the transfer device 200 is provided at a side of the first track 110. As an example, the transfer device 200 is positioned between a chamber wall of the vacuum chamber 102 and the first track 110. The transfer device 200 can extend along at least a portion of the first track 110. According to some embodiments, the transfer device 200 can extend at least partially within and/or through the vacuum chamber 102.

The term "transportation path" as used throughout the present disclosure can be understood as a way along which the substrate carrier 10 can be moved or conveyed in the vacuum chamber 102. As an example, the first transportation path T1 and/or the second transportation path T2 can be linear transportation paths. The first transportation path T1 and/or second transportation T2 can define the transport direction 1 for the substrate carrier 10 through the vacuum chamber 102. The first transportation path T1 and/or the second transportation path T2 can be unidirectional transportation paths or can be bidirectional transportation paths.

The apparatus 100 can have at least two transportation paths, such as the first transportation path T1 and the second transportation path T2. The at least two transportation paths can extend substantially parallel to each other, for example, in the transport direction 1 of the substrate carrier 10. In some implementations, the first transportation path T1 and the second transportation T2 can be displaced with respect to each other in the direction perpendicular to the transport direction 1 of the substrate carrier 10 and/or in a direction perpendicular to at least one of the first transportation path T1 and the second transportation path T2.

The at least two transportation paths can be provided by respective tracks. As an example, the first transportation path T1 is provided by the first track 110 and the second transportation path T2 is provided by the second track 120. As used throughout the present disclosure, the term "track" can be defined as a space or device that accommodates or supports the substrate carrier 10. As an example, the track can accommodate or support the substrate carrier 10 mechanically (using, for example, rollers) or contactlessly (using, for example, magnetic fields and respective magnetic forces).

According to some embodiments, which can be combined with other embodiments described herein, the apparatus 100 includes a magnetic levitation system (not shown) configured for a contactless levitation of the substrate carrier 10 in the vacuum chamber 102. The one or more tracks, such as the first track 110 and the second track 120, can be provided by the magnetic levitation system. The magnetic levitation system can be configured to hold the substrate carrier 10 without mechanical contact using magnetic fields and respective magnetic forces in a floating or levitating state, for example, below or above a respective track.

The process position P can be provided adjacent to a transportation path, such as the first transportation path T1 and/or the second transportation path T2. The process position P can be defined as a position in which the substrate 2 positioned on the substrate carrier 10 can be processed, for example, coated. The process position P can be provided in a processing region of a processing tool, such as a deposition source.

Figure 2A:
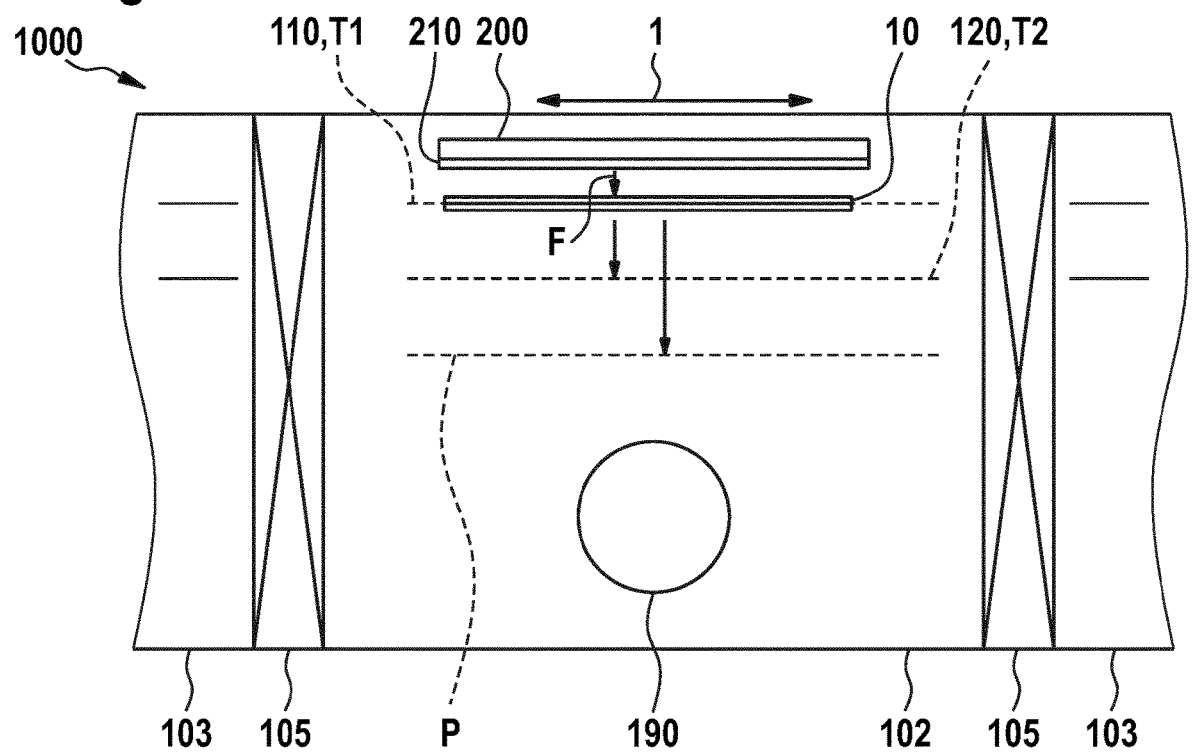
FIG. 2A shows a schematic view of a system for vacuum processing of a substrate according to embodiments described herein.

FIG. 2A shows a schematic view of a system 1000 for vacuum processing of a substrate according to embodiments described herein.

According to some implementations, the apparatus for transportation of the substrate carrier according to the embodiments described therein can be included in the system 1000. The system 1000 for vacuum processing can include one or more processing tools 190 in the vacuum chamber 102. The one or more processing tools 190 can be arranged adjacent to the process position P. As an example, the one or more processing tools 190 can include at least one processing tool selected from the group consisting of sputter sources, surface treatment tools, heating devices, cleaning devices, etching tools, and any combination thereof.

In some embodiments, the system 1000 for vacuum processing is a system for layer deposition including one or more deposition sources in the vacuum chamber 102 as processing tools 190. The one or more deposition sources can be arranged along at least one transportation path, such as the first transportation path T1 and/or the second transportation path T2. Optionally or alternatively, the one or more deposition sources can be arranged adjacent to the process position P. The one or more deposition sources can be sputter deposition sources. As an example, the one or more deposition sources can include sputter cathodes, such as rotatable cathodes. The cathodes can be planar or cylindrical cathodes having a target material to be deposited on the substrate.

As indicated in FIG. 2A, further chambers 103 can be provided adjacent to the vacuum chamber 102. The vacuum chamber 102 can be separated from adjacent chambers by valves 105. The atmosphere in the vacuum chamber 102 and/or the further vacuum chambers 103 can be individually controlled by generating a technical vacuum, for example with vacuum pumps connected to the vacuum chambers, and/or by inserting process gases in a deposition region in the vacuum chamber 102. According to some embodiments, process gases can include inert gases such as argon and/or reactive gases such as oxygen, nitrogen, hydrogen, activated gases or the like.

The term "vacuum" as used throughout the disclosure can be understood as a space that is substantially devoid of matter, e.g., a space from which all or most of the air or gas has been removed, except for process gases that are used in a deposition process, such as a sputter deposition process. As an example, the term "vacuum" can be understood in the sense of the above mentioned technical vacuum having a vacuum pressure of less than, for example, 10 mbar, specifically less than 0.01 mbar, such as about 0.003. One or more vacuum pumps, such as turbo pumps and/or cryo-pumps, can be connected to the vacuum chamber 102 and/or the further vacuum chambers 103 for generation of the vacuum inside the vacuum chamber 102.

According to some embodiments, which can be combined with other embodiments described herein, the system 1000 for vacuum processing, and specifically the apparatus for transportation of substrate carrier 10, further includes a drive system (not shown) configured for transportation of the substrate carrier 10 along the first transportation path T1 and/or the second transportation path T2. As an example, the drive system can be configured to convey the substrate carrier 10 in the transport direction 1. In some implementations, the drive system can be a magnetic drive system configured to contactlessly move the substrate carrier 10 along the transportation paths.

The first transportation path T1 and the second transportation path T2 can extend at least partially within and/or through the vacuum chamber 102. In some embodiments, at least one of the first transportation path T1 and the second transportation path T2 extends at least partially through one or more vacuum chambers of the further vacuum chambers 103. As an example, the first transportation path T1 and the second transportation path T2 can extend at least partially through the further vacuum chambers 103 adjacent to the vacuum chamber 102. Specifically, the substrate carrier 10 can be transported through the vacuum chamber 102 and the further vacuum chambers 103 by moving the substrate carrier 10 along the first transportation path T1 or the second transportation path T2 and through the valves 105.

According to some embodiments, which can be combined with other embodiments described herein, the transfer device 200 is provided at a side of the first track 110. As an example, the transfer device 200 is positioned between the chamber wall of the vacuum chamber 102 and the first track 110. The transfer device 200 can extend along at least a portion of the first track 110 in the vacuum chamber 102. The transfer device 200 can extend at least partially within and/or through the vacuum chamber 102.

According to some embodiments, which can be combined with other embodiments described therein, the transfer device 200 is configured to contactlessly guide at least a portion of the substrate carrier 10 during a transportation of the substrate carrier 10 along the first transportation path T1 (first track 110) or the second transportation path T2 (second track 120). As an example, the portion of the substrate carrier 10 guided by the transfer device 200 can be a top portion of the substrate carrier 10 when the substrate carrier 10 is in a vertical orientation. In some implementations, the transfer device 200 can extend through one or more of the vacuum chambers, such as the vacuum chamber 102 and the further vacuum chambers 103, to guide the substrate carrier 10 along the first transportation path T1 and/or the second transportation path T2.

The substrate carrier 10 is configured to support a substrate, for example, during a layer deposition process, such as a sputtering process. The substrate carrier 10 can include a plate or a frame configured for supporting the substrate 2, for example, using a support surface provided by the plate or frame. Optionally, the substrate carrier 10 can include one or more holding devices (not shown) configured for holding the substrate at the plate or frame. The one or more holding devices can include at least one of mechanical and/or magnetic clamps.

According to some embodiments, which can be combined with other embodiments described herein, the substrate carrier 10 is configured for supporting the substrate 2 in a substantially vertical orientation, in particular during a layer deposition process. As used throughout the present disclosure "substantially vertical" is understood particularly when referring to the substrate orientation, to allow for a deviation from the vertical direction or orientation of ±20° or below, e.g. of ±10° or below. This deviation can be provided for example because a substrate support with some deviation from the vertical orientation might result in a more stable substrate position. Yet, the substrate orientation, e.g., during the layer deposition process is considered substantially vertical, which is considered different from the horizontal substrate orientation.

The embodiments described herein can be utilized for evaporation on large area substrates, e.g., for display manufacturing. Specifically, the substrates or substrate carriers, for which the structures and methods according to embodiments described herein are provided, are large area substrates. For instance, a large area substrate or carrier can be GEN 4.5, which corresponds to about 0.67 m$^2$ substrates (0.73×0.92 m), GEN 5, which corresponds to about 1.4 m$^2$ substrates (1.1 m×1.3 m), GEN 7.5, which corresponds to about 4.29 m$^2$ substrates (1.95 m×2.2 m), GEN 8.5, which corresponds to about 5.7 m$^2$ substrates (2.2 m×2.5 m), or even GEN 10, which corresponds to about 8.7 m$^2$ substrates (2.85 m×3.05 m). Even larger generations such as GEN 11 and GEN 12 and corresponding substrate areas can similarly be implemented.

The term "substrate" as used herein shall particularly embrace substantially inflexible substrates, e.g., a wafer, slices of transparent crystal such as sapphire or the like, or a glass plate. However, the present disclosure is not limited thereto and the term "substrate" may also embrace flexible substrates such as a web or a foil. The term "substantially inflexible" is understood to distinguish over "flexible". Specifically, a substantially inflexible substrate can have a certain degree of flexibility, e.g. a glass plate having a thickness of 0.5 mm or below, wherein the flexibility of the substantially inflexible substrate is small in comparison to the flexible substrates.

Figure 2B:
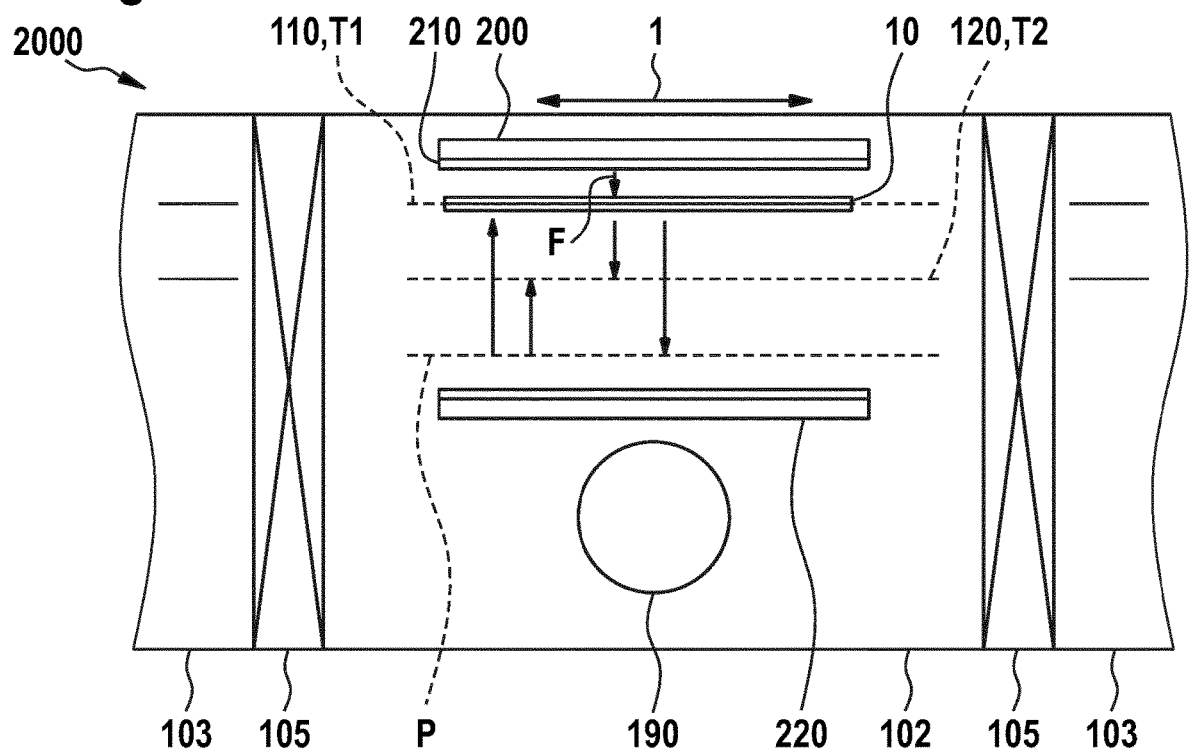
FIG. 2B shows a schematic view of a system for vacuum processing of a substrate according to further embodiments described herein.

FIG. 2B shows a schematic view of a system 2000 for vacuum processing of a substrate according to further embodiments described herein. The system 2000 of FIG. 2B is similar to the system 1000 of FIG. 2A, the difference being the system 2000 includes at least one second magnet device 220. The at least one second magnet device 220 can be configured similarly or even identically to the at least one first magnet device 210 described in the present disclosure.

According to some embodiments, which can be combined with other embodiments described herein, the system 2000 includes the at least one second magnet device 220 configured to provide a magnetic force acting on the substrate carrier 10 to contactlessly move the substrate carrier 10 from the one or more second positions to the first position. As an example, the at least one first magnet device 210 and the at least one second magnet device 220 can be provided on opposite sides of the first track 110, the second track 120 and the process position P. In other words, the first track 110, the second track 120 and the process position P are provided between the at least one first magnet device 210 and the at least one second magnet device 220.

In some implementations, the at least one first magnet device 210 and the at least one second magnet device 220 are configured to contactlessly move or push the substrate carrier 10 in opposite directions. The at least one first magnet device 210 can be configured to move the substrate carrier 10 in a first direction and the at least one second magnet device 220 can be configured to move the substrate carrier 10 in a second direction opposite the first direction. As an example, the least one first magnet device 210 can push the substrate carrier 10 from the first track 110 to the second track 120 and/or to the process position P, and/or can push the substrate carrier 10 from the second track 120 to the process position P. The at least one second magnet device 220 can push the substrate carrier 10 from the process position P to the second track 120 and/or the first track 110, and/or can push the substrate carrier 10 from the second track 120 to the first track 110. This is further illustrated with reference to FIGS. 3A to 3D. In another example, the least one second magnet device 220 can move (e.g., pull) the substrate carrier 10 from the first track 110 to the second track 120 and/or to the process position P, and/or can move (e.g., pull) the substrate carrier 10 from the second track 120 to the process position P. The at least one first magnet device 210 can move (e.g., pull) the substrate carrier 10 from the process position P to the second track 120 and/or the first track 110, and/or can move (e.g., pull) the substrate carrier 10 from the second track 120 to the first track 110.

FIGS. 3A-D show schematic views of a moving of a substrate carrier 10 between positions in a vacuum chamber according to embodiments described herein.

Figure 3A:
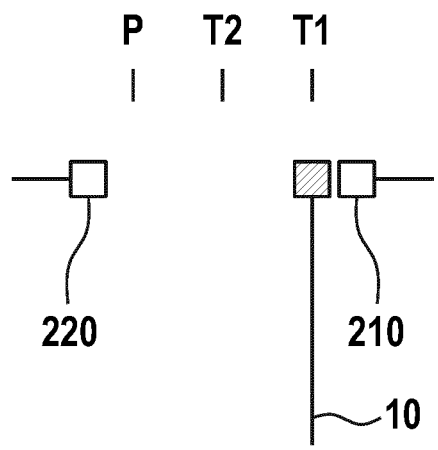
FIGS. 3A-D show schematic views of a moving of a substrate carrier between positions in a vacuum chamber according to embodiments described herein.

In FIG. 3A the substrate carrier 10 is in a first position on the first track or first transportation path T1. The at least one first magnet device 210 can be magnetically coupled to the substrate carrier 10. Specifically, the at least one first magnet device 210 can provide a magnetic field at the position of the substrate carrier 10, for example, at the top portion of the substrate carrier 10. The substrate carrier 10, for example, the top portion of the substrate carrier, can be positioned and held in a point of equilibrium of the magnetic field. As an example, the substrate carrier 10 can be held at a predetermined distance from the at least one first magnet device 210.

Figure 3B:
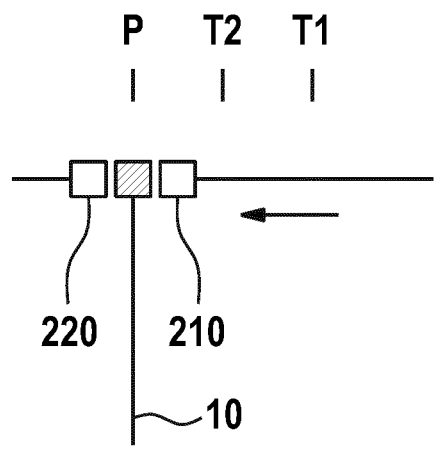

As shown in FIG. 3B, the substrate carrier 10 is moved by the at least one first magnet device 210 from the first position to a second position, which can be the process position P. In some implementations, the at least one first magnet device 210 can extend in a direction towards the second position in order to push or move the substrate carrier 10 in the direction towards the second position. During the pushing or moving, the substrate carrier 10 can still be positioned and/or held at the point of equilibrium of the magnetic field generated by the at least one first magnet device 210. As an example, the substrate carrier 10 can be held at the predetermined distance from the at least one first magnet device 210 pushing or moving.

Figure 3C:
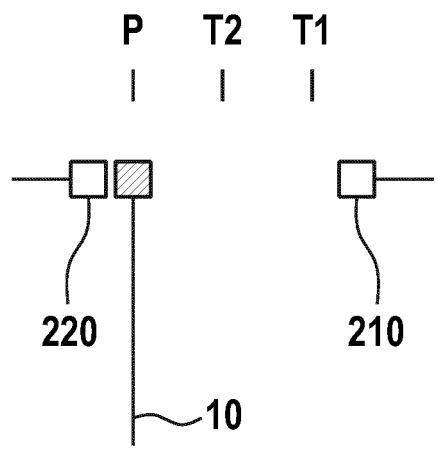

Once the substrate carrier 10 has reached the second position, the substrate carrier 10 can be transferred or handed over from the at least one first magnet device 210 to the at least one second magnet device 220. In some embodiments, the magnetic coupling between the at least one first magnet device 210 and the substrate carrier 10 can be released and a magnetic coupling between the at least one second magnet device 220 and the substrate carrier 10 can be established. As an example, at least a part of the magnetic field provided by the at least one first magnet device 210 can be deactivated or switched off in order to release the magnetic coupling between the at least one first magnet device 210 and the substrate carrier 10. A magnetic field provided by the at least one second magnet device 220 can be activated or switched on in order to establish the magnetic coupling between the at least one second magnet device 220 and the substrate carrier 10. The at least one first magnet device 210 can be retracted after the handover from the at least one first magnet device 210 to the at least one second magnet device 220, as it is shown in FIG. 3C. A substrate on the substrate carrier 10 can be processed, for example, coated, when the substrate carrier 10 is in the process position P.

Figure 3D:
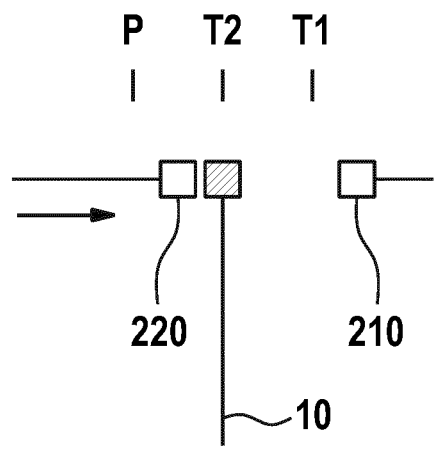

As shown in FIG. 3D, the at least one second magnet device 220 can extend to move or push the substrate carrier 10 from the second position, for example, the process position P, to the second transportation path T2. However, the at least one second magnet device 220 can also extend to move or push the substrate carrier 10 from the second position to the first transportation path T1. In some implementations, the substrate carrier 10 can then be transported along the respective transportation path, for example, while a top portion of the substrate carrier 10 is being guided by the at least one second magnet device 220.

In some implementations, the present disclosure provides a dual track system having two tracks, such as the first track and the second track. One single sided magnet bar (first magnet device and second magnet device) is positioned beside each track, specifically on the outer side, and not between the tracks. Each single sided magnet bar can have repellent and pulling magnets, which can be concordantly oriented to the magnets provided at the substrate carrier, for example, a guiding bar thereof. The substrate carrier is held in the point of equilibrium of the magnetic field of the single sided magnet bar. To change the track the single sided magnet bar of the track having the substrate carrier positioned thereon moves towards the second free track (together with the substrate carrier). Having arrived on the second track, the substrate carrier is passed to the single sided magnet bar of the second track. The now free first single sided magnet bar moves back towards the first track. The track change using the embodiments of present disclosure uses just a linear movement in one direction. No additional movement, for example, in the vertical direction, is needed.

Figure 4:
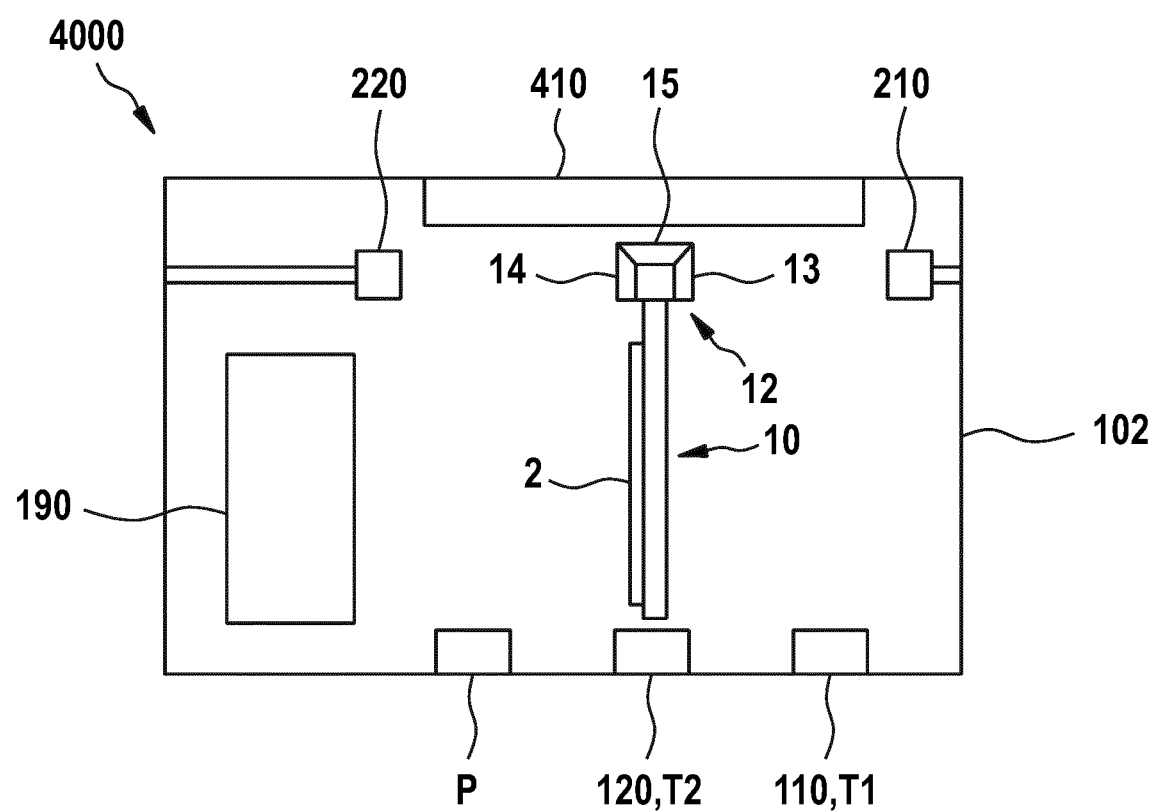
FIG. 4 shows a schematic view of a system for vacuum processing of a substrate according to embodiments described herein.

FIG. 4 shows a schematic view of a system 4000 for vacuum processing of a substrate 2 according to embodiments described herein. According to some implementations, the apparatus for transportation of the substrate carrier 10 according to the embodiments described therein can be included in the system 4000 for vacuum processing. The system 4000 of FIG. 4 is exemplarily shown with the first position (e.g., the first track 110) and two second positions (e.g., the second track 120 and the process position P). However, the present disclosure is not limited thereto, and the system 4000 can have only one second position (see, e.g., FIG. 1A) or three or more second positions.

According to some embodiments, which can be combined with other embodiments described herein, the at least one first magnet device 210 and/or the at least one second magnet device 220 is moveable between the at least one retracted position and at least one extended position. The substrate carrier 10 can be pushed when the at least one first magnet device 210 or the at least one second magnet device 220 is moved from the at least one retracted position to the at least one extended position. In some implementations, the at least one first magnet device 210 and/or the at least one second magnet device 220 is extendable and retractable in a direction substantially perpendicular to the first transportation path T1 and/or the second transportation path T2. In some implementations, the at least one first magnet device 210 and/or the at least one second magnet device 220 is extendable and retractable substantially horizontally.

The substrate carrier 10 having a substrate 2 provided thereon can be in a substantially vertical orientation. In some implementations, the system 4000 for vacuum processing can include a magnetic levitation system 410 configured for a contactless levitation of the substrate carrier 10 in, for example, the vertical orientation. The term "contactless levitation" or as used throughout the present disclosure can be understood in the sense that a weight of the substrate carrier 10 is not carried or held by a mechanical contact or mechanical forces, but is carried or held by a magnetic force. Specifically, the substrate carrier 10 is held in a levitating or floating state using magnetic forces instead of mechanical forces. As an example, the magnetic levitation system 410 has no mechanical means, such as rollers, that support the weight of the substrate carrier 10. In some implementations, there can be no mechanical contact between the substrate carrier and the system 4000 for vacuum processing at all. The contactless levitation is beneficial in that no particles are generated due to a mechanical contact between the substrate carrier 10 and sections of the system 4000 for vacuum processing, such as rollers. Accordingly, a purity of the layers deposited on the substrate 2 can be improved, in particular since a particle generation is minimized or even avoided.

The magnetic force provided by the magnetic levitation system 410 is sufficient to hold the substrate carrier 10 having the substrate 2 positioned thereon in the floating state. Specifically, the magnetic force can be equal to a total weight of the substrate carrier 10. The total weight of the substrate carrier 10 can include at least a weight of the (empty) substrate carrier and a weight of the substrate 2. As an example, a magnetic field generated by the magnetic levitation system 410 is selected such that the magnetic force is equal to the total weight of the substrate carrier 10 in order to keep the substrate carrier 10 in the suspended or levitating state.

In some implementations, the substrate carrier 10 can include one or more carrier magnet units 12. As an example, the one or more carrier magnet units 12 can be provided by the material of the substrate carrier 10. In other words, the material of at least a portion of the substrate carrier 10 can be a magnetic material (e.g., diamagnetic or ferromagnetic) such that a magnetic field generated by, for example, the at least one first magnet device 210, the at least one second magnet device 220 or the magnetic levitation system 410 can act on the substrate carrier 10 to provide a magnetic force for contactlessly holding or moving the substrate carrier 10. In some implementations, the one or more carrier magnet units 12 can be provided as separate entities, for example permanent magnets, that are mounted on the substrate carrier 10. The one or more carrier magnet units 12 can be provided at the top portion of the substrate carrier 10 when the substrate carrier 10 is the substantially vertical orientation.

The one or more carrier magnet units 12 can include one or more first carrier magnet units 13 at a side or side portion/section of the substrate carrier 10 facing the at least one first magnet device 210. The one or more first carrier magnet units 13 can be configured such that the magnetic field provided by the at least one first magnet device 210 can act on the one or more first carrier magnet units 13 to hold or move the substrate carrier 10. In some implementations, the first carrier magnet units 13 can be an array of carrier magnet units.

The one or more carrier magnet units 12 can include one or more second carrier magnet units 14 at a side or side portion/section of the substrate carrier 10 facing the at least one second magnet device 220. The one or more second carrier magnet units 14 can be configured such that the magnetic field provided by the at least one second magnet device 220 can act on the one or more second carrier magnet units 14 to hold or move the substrate carrier 10. In some implementations, the second carrier magnet units 14 can be an array of carrier magnet units.

In some embodiments, the one or more carrier magnet units 12 can include one or more levitation magnet units 15. The one or more levitation magnet units 15 can be provided at a portion/section of the substrate carrier 10 facing the magnetic levitation system 410. As an example, the one or more levitation magnet units 15 can be provided on top of the substrate carrier 10 when the substrate carrier 10 is in the substantially vertical orientation. The magnetic field provided by the magnetic levitation system 410 can act on the one or more levitation magnet units 15 to contactlessly hold the substrate carrier 10 in a floating or levitating state.

According to some implementations, at least some magnet units of the carrier magnet units 12 are permanent magnets, for example, ferromagnetic permanent magnets. In some embodiments, the substrate carrier 10 can not include any devices, such as electronic devices, that have a wired connection to the surroundings of the substrate carrier 10. In other words, the substrate carrier 10 can have no physical or mechanical connection to a surrounding of the substrate carrier 10. Having no such physical connections can be beneficial, since a particle generation due to moving elements can be reduced or even avoided.

According to further embodiments, which can be combined with other embodiments described herein, at least one of the at least one first magnet device 210 and the at least one second magnet device 220 can be omitted. As an example, the at least one first magnet device 210 can be replaced by at least one first contact device and/or the at least one second magnet device 220 can be replaced at least one second contact device. The first contact device and the second contact device can be configured to mechanically contact the substrate carrier 10.

The at least one first contact device and the at least one second contact device can be configured similarly to the at least one first magnet device 210 and the at least one second magnet device 220, respectively. As an example, the at least one first contact device and/or the at least one second contact device is moveable between the at least one retracted position and the at least one extended position. The substrate carrier 10 can be pushed when the at least one first contact device or the at least one second contact device mechanically contacts the substrate carrier 10 and is moved from the at least one retracted position to the at least one extended position. In some implementations, the at least one first contact device and/or the at least one second contact device is extendable and retractable in a direction substantially perpendicular to the first transportation path T1 and/or the second transportation path T2. In some implementations, the at least one first contact device and/or the at least one second contact device is extendable and retractable substantially horizontally.

The system for vacuum processing having the at least one first contact device and the at least one second contact device can include the magnetic levitation system configured for a contactless levitation of the substrate carrier 10 in, for example, the vertical orientation.

Figure 5A:
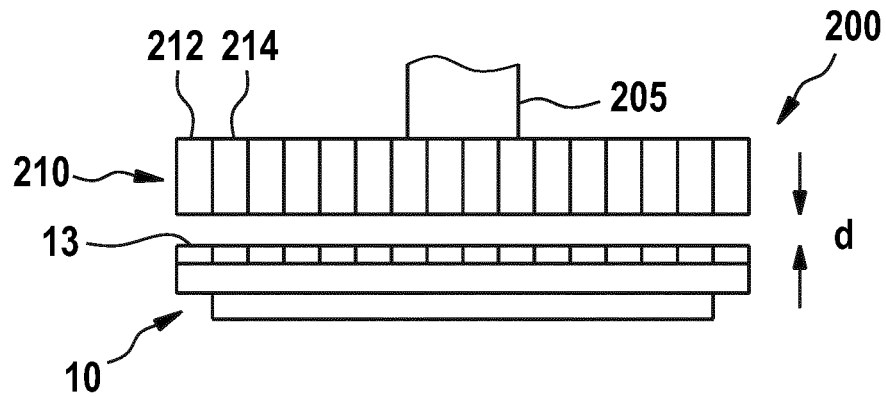
FIGS. 5A-C show schematic views of a magnet device having a plurality of magnet units according to embodiments described herein.
Figure 5B:
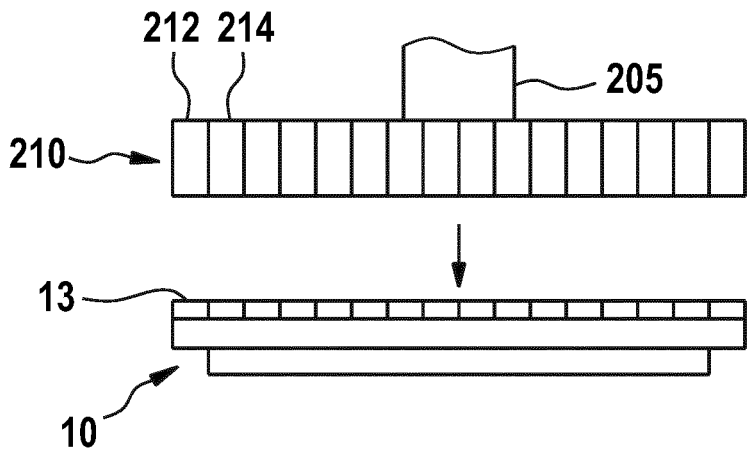

FIGS. 5A and 5B show schematic views of a transfer device 200 having a plurality of magnet units and a substrate carrier 10 according to embodiments described herein. Although the following description is given with reference to the at least one first magnet device 210, it is to be understood that the at least one second magnet device 220 can be configured identically or similarly.

According to some embodiments, which can be combined with other embodiments described herein, the transfer device 200 includes the at least one first magnet device 210 and a movement device 205 connected to the at least one first magnet device 210. The movement device 205 is configured to move (e.g., extend and retract) the at least one first magnet device 210, for example, between the at least one retracted position and the at least one extended position. In some implementations, the movement device 205 is configured to move the at least one first magnet device 210 to push or pull the substrate carrier 10 towards another position, such as the second position. The movement device 205 can be configured to move the at least one first magnet device 210 in a direction substantially perpendicular to the first transportation path and/or the second transportation path. Likewise, the transfer device 200 can include a movement device connected to the at least one second magnet device.

In some implementations, the at least one first magnet device 210 includes one or more first magnet units 212 configured to generate a first magnetic field, and one or more second magnet units 214 configured to generate a second magnetic field different from the first magnetic field. Specifically, the one or more first magnet units 212 can be configured to generate the first magnetic field at the position of the substrate carrier 10, and the one or more second magnet units 214 can be configured to generate the second magnetic field at the position of the substrate carrier 10. The first magnetic field and the second magnetic field can be superposed to provide a net magnetic field at the position of the substrate carrier 10, and specifically at the position of the one or more carrier magnet units 12, e.g., the one or more first carrier magnet units 13.

At least one magnetic field of the first magnetic field and the second magnetic field can be adjusted to alter the net magnetic field at the position of the substrate carrier 10. According to some embodiments, the apparatus for transportation of the substrate carrier 10 is configured to adjust at least one magnetic field of the first magnetic field and the second magnetic field to provide the magnetic force acting on the substrate carrier 10 to move or push the substrate carrier 10, as it is indicated with the arrow in FIG. 5B. As an example, the net magnetic field can be selected such that the repulsive magnetic force is acting on the substrate carrier 10 to contactlessly move the substrate carrier 10 from the first position to the one or more second positions, or vice versa.

According to some embodiments, the apparatus for transportation of the substrate carrier 10 is configured to adjust at least one magnetic field of the first magnetic field and the second magnetic field to keep the substrate carrier 10 at a predetermined distance d from the at least one first magnet device 210. As an example, the net magnetic field can be selected such that the substrate carrier 10 is held at the predetermined distance d from the at least one first magnet device 210. The net magnetic field can exhibit a point or region of equilibrium. The substrate carrier 10 can be locked and held at the point or in the region of equilibrium at the predetermined distance d from the at least one first magnet device 210.

The point or region of equilibrium can be understood as a point or region, in which no net magnetic force is acting on the substrate carrier 10. Specifically, when the substrate carrier 10 moves out of the point or region of equilibrium, a net magnetic force is acting on the substrate carrier 10 to move the substrate carrier 10 back to the point or region of equilibrium. In some implementations, the net magnetic field is selected to hold the substrate carrier 10 at the predetermined distance d from the at least one first magnet device 210 to contactlessly guide the substrate carrier 10 during a transportation of the substrate carrier 10 along the first track or the second track.

In some implementations, the predetermined distance d between the substrate carrier 10 and the at least one first magnet device 210 and/or the at least one second magnet device 220 is less than 30 mm, specifically less than 20 mm, and more specifically less than 10 mm. As an example, the predetermined distance d can be in a range of between 0 to 20 mm, specifically in a range of between 5 to 15 mm, and more specifically in a range of between 5 to 10 mm.

According to some embodiments, which can be combined with other embodiments described herein, at least one magnetic field of the first magnetic field and the second magnetic field is a static or dynamic magnetic field. The magnetic field, and specifically a magnetic field strength, can be dynamically adjusted. As an example, the magnetic field can be adjusted based on the position of the substrate carrier 10 such that the substrate carrier 10 is kept at the predetermined distance from the at least one first magnet device 210 or is pushed.

In some implementations, the first magnet units 212 can have a first magnetic pole orientation and the second magnet units can have a second magnetic pole orientation different from the first magnetic pole orientation. Specifically, the same poles (south poles or north poles) can be oriented in opposite directions. As an example, the magnetic north poles of the first magnet units 212 and the magnetic south poles of the second magnet units 214 can face towards the substrate carrier 10. The magnetic south poles of the first magnet units 212 and the magnetic north poles of the second magnet units 214 can face away from the substrate carrier 10, for example, towards a wall of the vacuum chamber. In another example, the magnetic south poles of the first magnet units 212 and the magnetic north poles of the second magnet units 214 can face towards the substrate carrier 10. The magnetic north poles of the first magnet units 212 and the magnetic south poles of the second magnet units 214 can face away from the substrate carrier 10, for example, towards a wall of the vacuum chamber.

The first magnet units 212 and the second magnet units 214 can be arranged in a regular or irregular manner. As an example, the first magnet units 212 and the second magnet units 214 can be alternately arranged (i.e., "ABAB . . . ", wherein "A" denotes first magnet units 212 and "B" denotes the second magnet units 214). An equal number of first magnet units 212 and second magnet units 214 can be provided. In another example, groups of first magnet units 212 and groups of second magnet units 214 are alternately arranged (i.e., "AABAAB . . . " "AABBAABB . . . ", and the like).

According to some embodiments, which can be combined with other embodiments described therein, the first magnet units 212 and the second magnet units 214 form a first array of magnet units. The one or more carrier magnet units, such as the one or more first carrier magnet units 13 and/or the one or more second carrier magnet units, can form a second array of magnet units. In some implementations, each magnet unit of the first array of magnet units faces a corresponding magnetic unit of the second array of magnet units. The magnetic poles of the magnet units facing each other can be opposite magnetic poles. As an example, north poles of the magnet units of the first array face south poles of the magnet units of the second array, and south poles of the magnet units of the first array face north poles of the magnet units of the second array.

According to some embodiments, which can be combined with other embodiments described herein, the one or more first magnet units 212 and/or the one second magnet units 214 include at least one of permanent magnets and electromagnets. As an example, the one or more first magnet units 212 are permanent magnets and the one or more second magnet units 214 are electromagnets. Alternatively, the one or more first magnet units 212 are electromagnets and the one or more second magnet units 214 are permanent.

In some implementations, the apparatus is configured to change at least one magnetic field of the first magnetic field and the second magnetic field by activating or deactivating at least one electromagnet of the one or more first magnet units 212 or the one or more second magnet units 214. As an example, the electromagnets can generate a magnetic field that provides an attracting force acting on the substrate carrier 10. The handover between the at least one first magnet device and the at least one second magnet device (an example is shown in FIG. 3B), can be conducted by a controlling of one or more electromagnets. In other words, by switching on and a switching off of attracting components of the magnetic field acting on the substrate carrier 10, the substrate carrier 10 can be transferred from one magnet device to another magnet device. As an example, the electromagnets of the first magnet device can be switched off and the electromagnets of the second magnet device can be switched on in order to hand over the substrate carrier from the first magnet device to the second magnet device. Using the electromagnets allows for a simple control and adjustment of the magnetic field, such as the net magnetic field, acting on the substrate carrier 10.

According to some embodiments, which can be combined with other embodiments described herein, the electromagnet is selected from the group consisting of: a solenoid, a coil, a superconducting magnet, and any combination thereof. The magnetic field can be a static or a dynamic magnetic field.

Figure 5C:
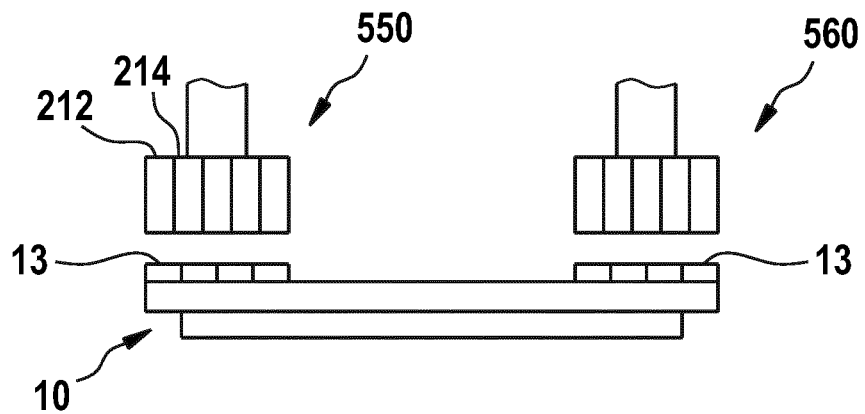

FIG. 5C shows a schematic view of a magnet device having a plurality of magnet units according to further embodiments described herein. The magnet device of FIG. 5C can be configured similarly to the first magnet device and the second magnet device described before, the difference being that magnet device is divided in a first portion 550 and a second portion 560.

Each of the first portion 550 and the second portion 560 can have one or more magnet units, such as one or more first magnet units 212 and one or more second magnet units 214. The first portion 550 and the second portion 560 can be spaced apart from each other in a direction substantially perpendicular to the first transportation path T1 and/or the second transportation path T2. As an example, the first portion 550 can provide a magnetic field acting on a front edge portion of the substrate carrier 10, and the second portion 560 can provide a magnetic force acting on a rear or tailing edge portion of the substrate carrier 10.

In some implementations, the first portion 550 and the second portion 560 can be extendable and retractable independently from each other. A position and/or orientation of the substrate carrier 10 with respect to, for example, the first transportation track, the second transportation track, and the process position can be adjusted by independently extending and retracting at least one portion of the first portion 550 and the second portion 560.

Figure 6A:
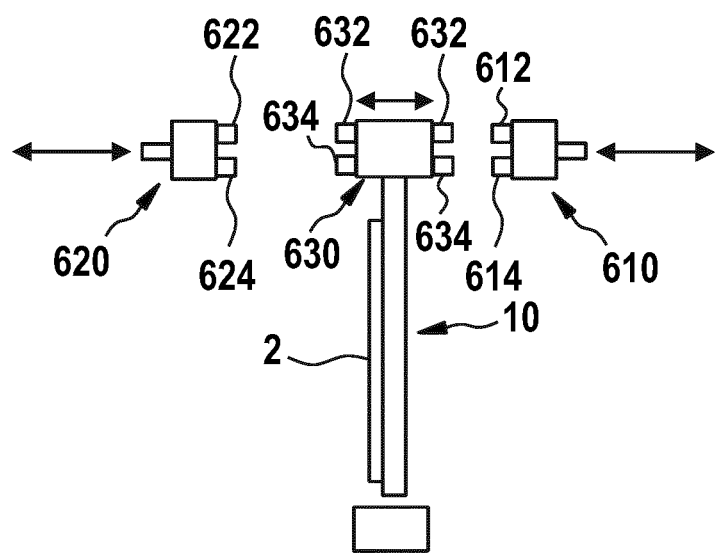
FIGS. 6A and B show schematic views of a moving of a substrate carrier between positions in a vacuum chamber using a transfer device according to further embodiments described herein.

FIGS. 6A and B show schematic views of a transfer device having a plurality of magnet units according to further embodiments described herein.

According to some embodiments, which can be combined with other embodiments described herein, the transfer device includes the at least one first magnet device 610 and the movement device connected to the at least one first magnet device 610. The movement device is configured to move (e.g., extend and retract) the at least one first magnet device 610 as described, for example, with respect to FIGS. 3A-D and 5A-C. Likewise, the transfer device can include the movement device connected to the at least one second magnet device 620.

The at least one first magnet device 610 includes one or more first magnet units 612 configured to generate a first magnetic field, and one or more second magnet units 614 configured to generate a second magnetic field different from the first magnetic field. The one or more first magnet units 612 and the one or more second magnet units 614 can be vertically arranged above each other. As an example, the one or more second magnet units 614 can be arranged below the one or more first magnet units 612.

The at least one second magnet device 620 can be configured similarly or identical to the at least one first magnet device 610. In particular, the at least one second magnet device 620 can include the one or more first magnet units, such as magnet units 622, configured to generate a first magnetic field, and the one or more second magnet units, such as magnet units 624, configured to generate a second magnetic field different from the first magnetic field.

The transfer device can have one or more carrier magnet units 630 mounted at the carrier 10, for example, on a top portion of the carrier 10. The one or more carrier magnet units 630 can include at least one of one or more first carrier magnet units 632 and one or more second carrier magnet units 634. An example, one or more first carrier magnet units 632 and one or more second carrier magnet units 634 can be arranged to face towards the at least one first magnet device 610. Likewise, one or more first carrier magnet units 632 and one or more second carrier magnet units 634 can be arranged to face towards the at least one second magnet device 620.

In some implementations, the one or more first carrier magnet units 632 can be arranged to face towards the one or more first magnet units 612 and the one or more second carrier magnet units 634 can be arranged to face towards the one or more second magnet units 614. The one or more first carrier magnet units 632 and the one or more second carrier magnet units 634 can be vertically arranged above each other. As an example, the one or more second carrier magnet units 634 can be arranged below the one or more first carrier magnet units 632.

According to some embodiments, a magnetic polarity of the one or more first magnet units 612, the one or more second magnet units 614, the one or more first carrier magnet units 632, and the one or more second carrier magnet units 634 can be selected such that the substrate carrier 10 can be locked and held at the predetermined distance (in FIG. 5A indicated with reference numeral "d") from the at least one first magnet device 610 and/or the at least one second magnet device 620. Additionally or alternatively, the magnetic polarity of the one or more first magnet units 612, the one or more second magnet units 614, the one or more first carrier magnet units 632, and the one or more second carrier magnet units 634 can be selected such that the substrate carrier 10 is moved (e.g., pushed or pulled) between at least two positions, such as the first position, the second position and/or the process position. In some implementations, the magnetic polarity of at least one of the magnet units can be changed, for example, to switch from the holding (or locking) state to the moving state, or vice versa.

Figure 6B:
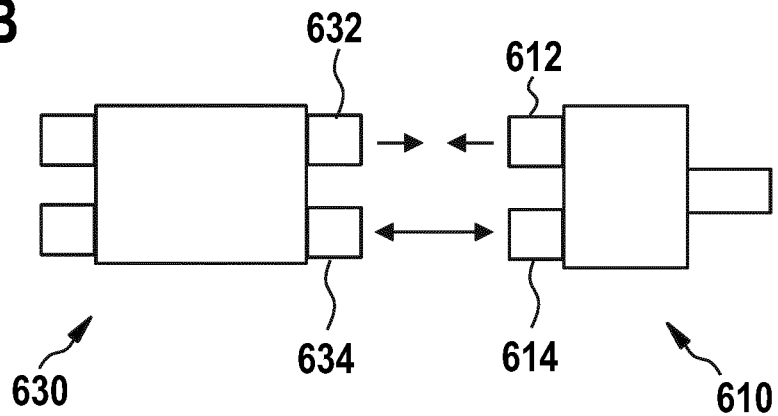

As shown in FIG. 6B, according to some embodiments, a first pair of magnet units, such as the one or more first magnet units 612 and the one or more first carrier magnet units 632, is configured to attract each other, and a second pair of magnet units, such as the one or more second magnet units 614 and the one or more second carrier magnet units 634, is configured to repel each other, or vice versa. A magnetic force between the one or more carrier magnet units 630 and the magnet units of the at least one first magnet device 610 and/or the at least one second magnet device 620 can be adjusted, for example, by controlling a magnetic field generated by at least one of the magnet units. As an example, the magnetic field of one or more of the magnet units can be changed, for example, to switch from the holding (or locking) state to the moving state, or vice versa.

Figure 7:
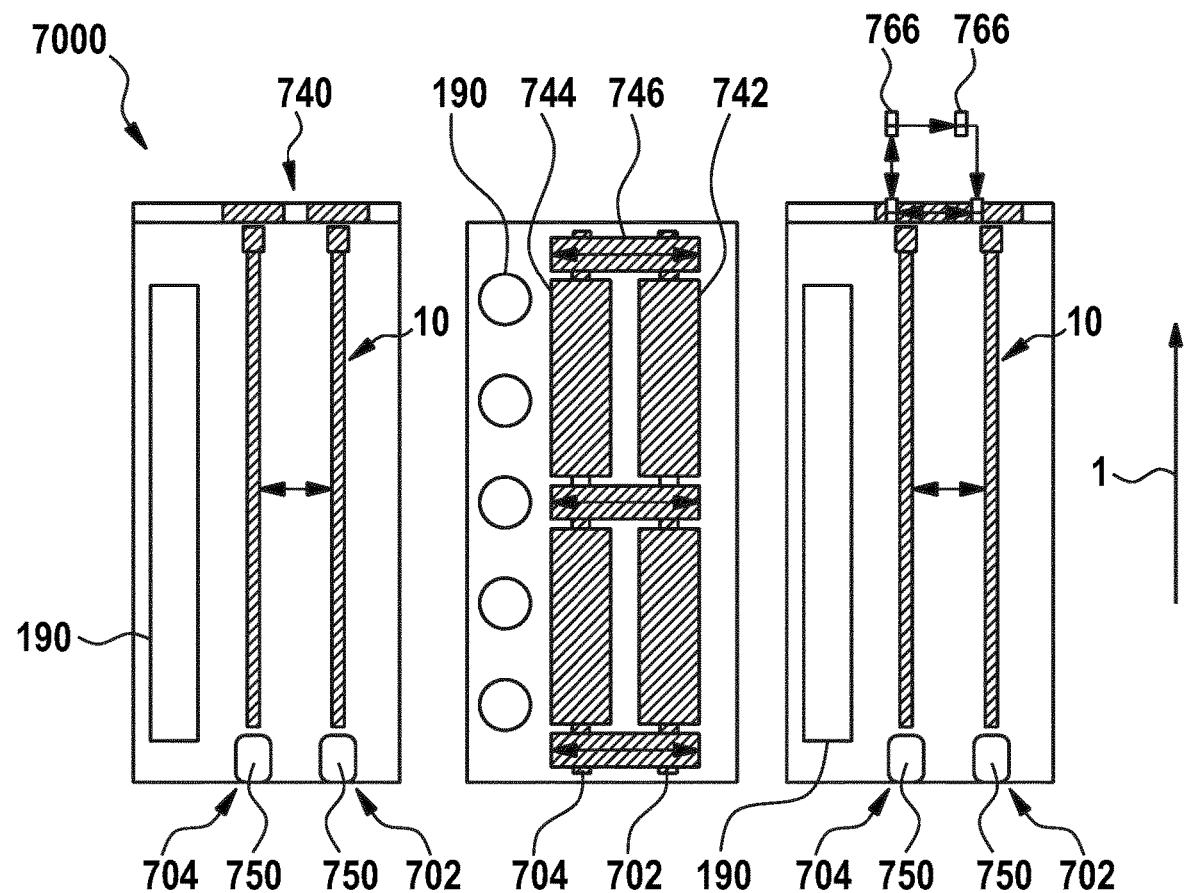
FIG. 7 shows schematic views of a system for vacuum processing of a substrate according to further embodiments described herein.

FIG. 7 shows schematic views of a system 7000 for vacuum processing of a substrate according to further embodiments described herein. According to some implementations, the apparatus for transportation of the substrate carrier 10 according to the embodiments described therein can be included in the system 7000 for vacuum processing. The system 7000 of FIG. 7 is exemplarily shown with the first position 702 (e.g., the first track) and one second position 704 (e.g., the second track and/or the process position). However, the present disclosure is not limited thereto, and the system can have two or more second positions.

According to some embodiments, the system 7000, and specifically the apparatus for transportation of the substrate carrier 10, includes a magnetic levitation system 740 configured to hold the substrate carrier 10 in a floating or levitating state, for example, during transportation of the substrate carrier 10 and/or processing of the substrate. The magnetic levitation system 740 can be provided above the substrate carrier 10.

The magnetic levitation system 740 can have one or more sections, such as one or more first sections 742 provided at the first position 702 (e.g., at or above the first track and/or transportation path) and one or more second sections 744 provided at the second position (e.g., at or above the second transportation path and/or the process position). Two or more first sections of the magnetic levitation system 740 can be provided at the first position 702. Two or more second sections of the magnetic levitation system 740 can be provided at the second position 704. The two or more sections above each position can be spaced apart from each other along the transport direction 1.

The apparatus for transportation (lateral displacement) of the substrate carrier 10 can be provided at one or more positions in the space between two adjacent sections of the two or more sections, as it is shown in the example of FIG. 7. Specifically, the apparatus for transportation of the substrate carrier 10 can have one or more transportation units 746, such as one or more lateral transportation units. The one or more transportation units 746 can extend between two adjacent sections of the magnetic levitation system 740 and/or can extend in a direction substantially perpendicular to the transport direction 1. As an example, each of the one or more transportation units 746 can extend above the first position 702 and the second position 704. The one or more transportation units 746 are configured for a lateral displacement of the substrate carrier 10 from the first position 702 to the second position 704 and/or from the second position 704 to the first position 702.

The one or more transportation units 746 can each include one or more magnet units 766 configured to provide a magnetic force acting on the substrate carrier 10 to move the substrate carrier 10 between the first position 702 and the second position 704. The one or more magnet units 766 can be movable in a first direction substantially perpendicular to the first transportation path and/or the second transportation path for transportation of the substrate carrier 10 between the first position 702 and the second position 704. The first direction can be a horizontal direction. The one or more magnet units 766 can be movable in a second direction substantially perpendicular to the first direction. As an example, the second direction can be a vertical direction.

In some implementations, the one or more magnet units 766 can be moveable between a lowered position and a raised position, for example, using a movement in the second direction. The one or more magnet units 766 are further away from the substrate carrier 10 in the raised position than in the lowered position. The one or more magnet units 766 can be in the lowered position to move the substrate carrier 10 between the first position 702 and the second position 704. The one or more magnet units 766 can be in the raised position to move between the first position 702 and a second position 704 without moving the substrate carrier 10. Specifically, in the raised position the one or more magnet units 766 can be distanced from the substrate carrier 10 such that a magnetic force acting on the substrate carrier 10 is not sufficient to affect or move the substrate carrier 10. Moving the one or more magnet units 766 in the raised position can prevent that a magnetic force generated by the one or more magnet units 766 affects the substrate carrier 10. A destabilizing of the positioning of the substrate carrier 10 during a movement of the one or more magnet units 766 between the first position 702 and the second position 704 can be reduced or even avoided.

The system 7000 can further include a drive system configured for transportation of the substrate carrier 10 along the first transportation path and/or the second transportation path. As an example, the drive system can be configured to convey the substrate carrier 10 in the transport direction 1. In some implementations, the drive system can be a magnetic drive system configured to contactlessly move the substrate carrier 10 along the transportation path. The drive system can be provided below the substrate carrier 10. The drive system can include one or more drive units 750 configured to convey the substrate carrier 10 in the transport direction 1. According to some embodiments, each transportation path, such as the first transportation path and the second transportation path, can include a respective drive unit. The drive units 750 can be fixed in position.

Figure 8A:
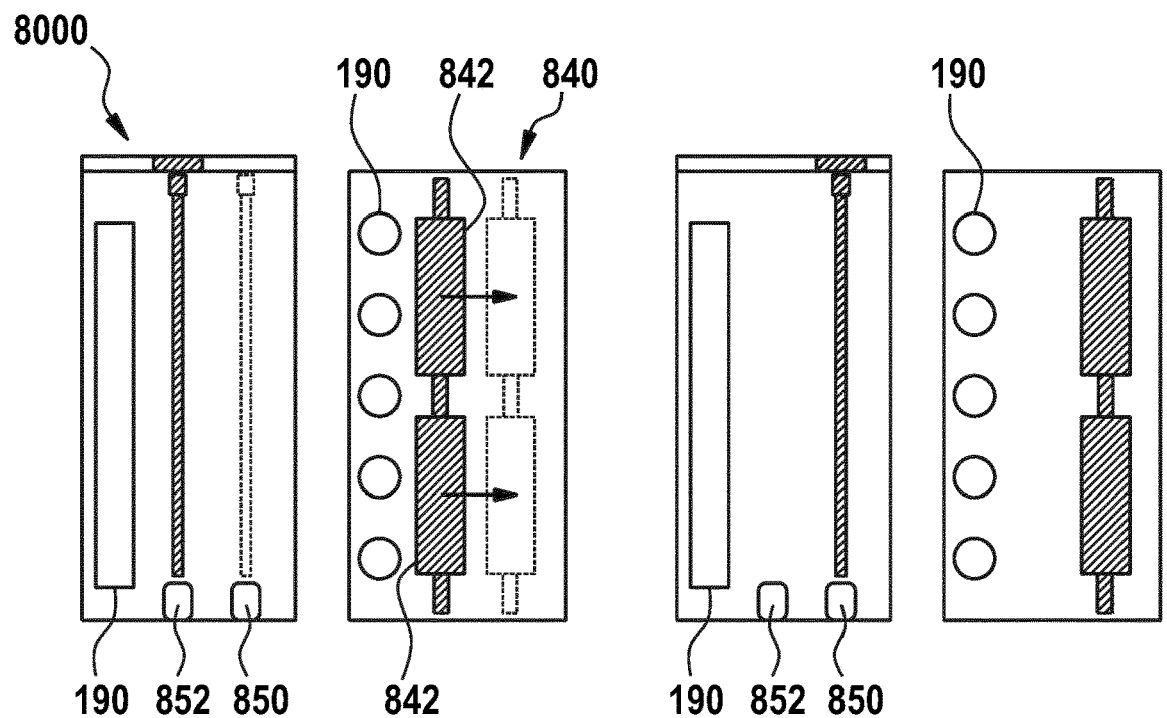
FIGS. 8A and B show schematic views of a system for vacuum processing of a substrate according to yet further embodiments described herein.

FIG. 8A shows schematic views of a system 8000 for vacuum processing of a substrate according to yet further embodiments described herein. The system 8000 of FIG. 8A is similar to the system shown in FIG. 7, and a description of similar or identical aspects is not repeated.

The system 8000 has the magnetic levitation system 840. The magnetic levitation system 840 can be movable in a direction substantially perpendicular to the first transportation path and/or the second transportation path. As an example, the magnetic levitation system 840 can have one or more sections 842, wherein the one or more sections 842 can be movable in the direction substantially perpendicular to the first transportation path and/or the second transportation path. In some implementations, the magnetic levitation system 840, and specifically the one or more sections 842, can be movable between the first position and the one or more second positions for transportation of the substrate carrier 10 between the first position and the one or more second positions.

The system 8000 can further include the drive system configured for transportation of the substrate carrier 10 along the first transportation path and/or the second transportation path. The drive system can include one or more drive units configured to convey the substrate carrier 10 in the transport direction 1, and specifically along the first transportation path and/or the second transportation path. According to some embodiments, each transportation path, such as the first transportation path and the second transportation path, can include a respective drive unit. As an example, one or more first drive units 850 can be provided at the first transportation path and one or more second drive units 852 can be provided at the second transportation path. The one or more drive units can be fixed in position.

Figure 8B:
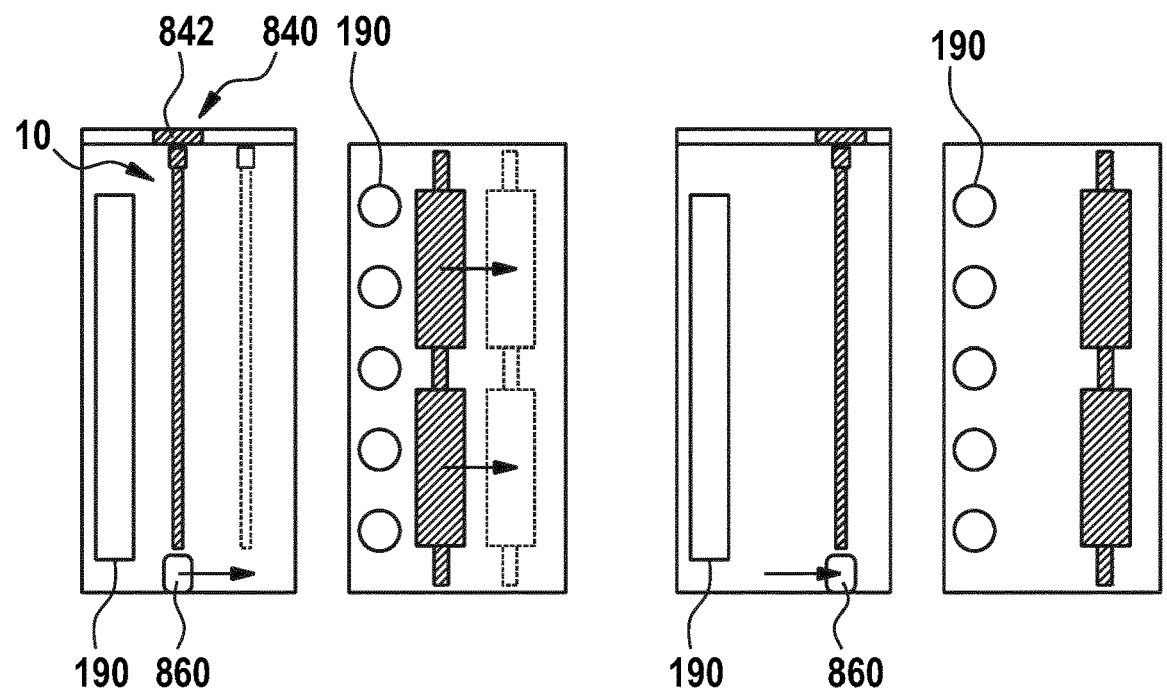

FIG. 8B shows schematic views of a system for vacuum processing of a substrate according to yet further embodiments described herein. The system of FIG. 8B is similar to the system shown in FIG. 8A, and a description of similar or identical aspects is not repeated.

The system includes the drive system for conveying the substrate carrier 10 along the first transportation path and/or the second transportation path. The drive system includes one or more drive units 860 configured to convey the substrate carrier 10 in the transport direction 1, and specifically along the first transportation path and the second transportation path. The one or more drive units 860 can be movable in a direction substantially perpendicular to the first transportation path and/or the second transportation path. As an example, the one or more drive units 860 can be configured to move together with the substrate carrier 10 when the substrate carrier 10 is moved from the first position to the second position or vice versa. The movable drive system can reduce a number of drive units for the first transportation path and the second transportation path. Manufacturing and/or maintenance costs can be reduced.

Figure 9:
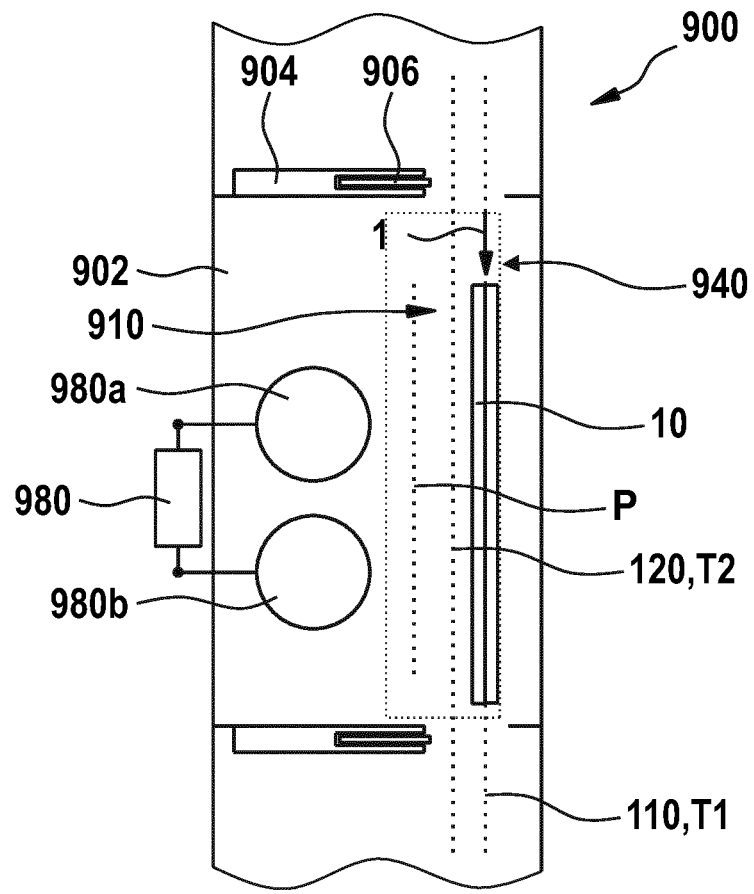
FIG. 9 shows a schematic view of a system for vacuum processing of a substrate according to embodiments described herein.

FIG. 9 shows a schematic view of a system 900 for vacuum processing of a substrate. The system 900 can be configured for layer deposition, such as sputter deposition, on the substrate.

According to some embodiments described herein, the system 900 includes a vacuum chamber 902 (also referred to as "vacuum deposition chamber", "deposition chamber" or "vacuum processing chamber"), the apparatus 940 for transportation of a substrate carrier according to the embodiments described herein, and one or more processing tools arranged along at least one of the first track and the second track. The one or more processing tools can be selected from the group consisting of sputter sources, surface treatment tools, heating devices, cleaning devices, etching tools, and any combination thereof As an example, the one or more processing tools can include one or more sputter deposition sources, such as a first sputter deposition source 980a and a second sputter deposition source 980b in the vacuum chamber 902. A substrate carrier 10 for supporting at least one substrate during a sputter deposition process is transported into and through the vacuum chamber 902, and in particular through a deposition area 910. The substrate carrier 10 can be configured according to any one of the embodiments described herein. The first sputter deposition source 980a and the second sputter deposition source 980b can, for example, be rotatable cathodes having targets of the material to be deposited on the substrate(s).

The system 900 can include the magnetic drive system configured to transport the substrate carrier 10 without mechanical contact using magnetic fields and respective magnetic forces into, through and/or out of the vacuum chamber 902. Alternatively or optionally, the system 900 can include the magnetic levitation system configured to hold the substrate carrier 10 in a floating or levitating state, for example, during transportation of the substrate carrier 10 and/or processing of the substrate.

As indicated in FIG. 9, further chambers can be provided adjacent to the vacuum chamber 902. The vacuum chamber 902 can be separated from adjacent chambers by a valve having a valve housing 904 and a valve unit 906. After the substrate carrier 10, with the at least one substrate thereon is inserted into the vacuum chamber 902 as indicated by the arrow, the valve unit 906 can be closed. The atmosphere in the vacuum chambers 902 can be individually controlled by generating a technical vacuum, for example with vacuum pumps connected to the vacuum chamber, and/or by inserting process gases in the deposition area 910 in the vacuum chamber 902. According to some embodiments, process gases can include inert gases such as argon and/or reactive gases such as oxygen, nitrogen, hydrogen and ammonia (NH3), Ozone (O3), activated gases or the like.

The sputter deposition process can be an RF frequency (RF) sputter deposition process. As an example, the RF sputter deposition process can be used when the material to be deposited on the substrate is a dielectric material. Frequencies used for RF sputter processes can be about 13.56 MHZ or higher.

According to some embodiments described herein, the system 900 can have an AC power supply 980 connected to the one or more sputter deposition sources. As an example, the first sputter deposition source 980a and the second sputter deposition source 980b can be connected to the AC power supply 980 such that the first sputter deposition source 980a and the second sputter deposition source 980b can be biased in an alternating manner. The one or more sputter deposition sources can be connected to the same AC power supply. In other embodiments, each sputter deposition source can have an own AC power supply.

According to embodiments described herein, the sputter deposition process can be conducted as magnetron sputtering. As used herein, "magnetron sputtering" refers to sputtering performed using a magnet assembly, e.g., a unit capable of generating a magnetic field. Such a magnet assembly can consist of a permanent magnet. This permanent magnet can be arranged within a rotatable target or coupled to a planar target in a manner such that the free electrons are trapped within the generated magnetic field generated below the rotatable target surface. Such a magnet assembly can also be arranged coupled to a planar cathode. Magnetron sputtering can be realized by a double magnetron cathode, e.g. the first sputter deposition source 980a and the second sputter deposition source 980b, such as, but not limited to, a TwinMag™ cathode assembly.

The substrate carriers 10 and the apparatuses and systems utilizing the substrate carriers 10 described herein can be used for vertical substrate processing. According to some implementations, the substrate carrier 10 of the present disclosure is configured for holding at least one substrate in a substantially vertical orientation. The term "vertical substrate processing" is understood to distinguish over "horizontal substrate processing". For instance, vertical substrate processing relates to a substantially vertical orientation of the substrate carrier and the substrate during substrate processing, wherein a deviation of a few degrees, e.g. up to 10° or even up to 15°, from an exact vertical orientation is still considered as vertical substrate processing. The vertical direction can be substantially parallel to the force of gravity. As an example, the system 900 can be configured for layer deposition on a vertically oriented substrate.

According to some embodiments, the substrate carrier 10 and the substrate are static or dynamic during sputtering of the deposition material. According to some embodiments described herein, a dynamic sputter deposition process can be provided, e.g., for display manufacturing.

Figure 10:
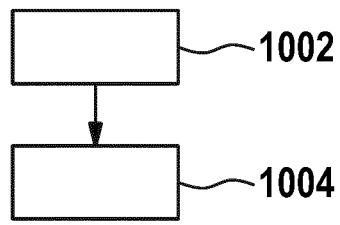
FIG. 10 shows a flow chart of a method for transportation of a substrate carrier in a vacuum chamber according to embodiments described herein.

FIG. 10 shows a flowchart of a method for transportation of a substrate carrier in a vacuum chamber. The method can utilize the apparatus for transportation of the substrate carrier according to the embodiments described herein.

The method includes, in block 1002, providing a repulsive magnetic force acting on the substrate carrier. In block 1004, the substrate carrier is contactlessly moved from a first position on a first track providing a first transportation path for the substrate carrier to a second position away from the first track, wherein the second position is at least one of a position on a second track and a process position for processing of a substrate.

According to embodiments described herein, the method for transportation of a substrate carrier in a vacuum chamber can be conducted by means of computer programs, software, computer software products and the interrelated controllers, which can have a CPU, a memory, a user interface, and input and output means being in communication with the corresponding components of the apparatus for processing a large area substrate.

The present disclosure has at least some of the following advantages. The embodiments allow for a contactless moving of the substrate carrier using a magnetic force, such as a repulsive (or repellent) magnetic force or an attracting magnetic force. In other words, the present disclosure does not use any mechanical force to move the substrate, but magnetically pushes or pulls the substrate carrier towards a new position. A particle generation inside of the vacuum chamber can be reduced or even avoided. A purity and a quality of the layers deposited on the substrate can be improved. Further, a facilitated track change between at least two tracks in a vacuum chamber is provided.

While the foregoing is directed to embodiments of the disclosure, other and further embodiments of the disclosure may be devised without departing from the basic scope thereof, and the scope thereof is determined by the claims that follow.

The invention claimed is:

1. Apparatus for transportation of a substrate carrier in a vacuum chamber, comprising:
a first track providing a first transportation path for the substrate carrier; and
a transfer device configured for contactlessly moving the substrate carrier from a first position on the first track to one or more second positions away from the first track,
wherein the one or more second positions include at least one of a position on a second track and a process position for processing of a substrate, and wherein the transfer device comprises:
at least one first magnet device configured to provide a magnetic force acting on the substrate carrier to contactlessly move the substrate carrier from the first position to the one or more second positions, wherein the at least one first magnet device is moveable towards the one or more second positions to contactlessly move the substrate carrier from the first position to the one or more second positions.

2. The apparatus of claim 1, wherein the transfer device is configured for contactlessly moving the substrate carrier in a direction different from a direction of the first transportation path.

3. The apparatus of claim 2, wherein the transfer device is configured for contactlessly moving the substrate carrier in a direction perpendicular to the first transportation path.

4. The apparatus of claim 1, wherein the at least one first magnet device is configured to provide a repulsive magnetic force acting on the substrate carrier to push the substrate carrier from the first position to the one or more second positions.

5. The apparatus of claim 1, wherein the second track provides a second transportation path parallel to the first transportation path.

6. The apparatus of claim 1, wherein the transfer device is further configured to contactlessly guide at least a portion of the substrate carrier during a transportation of the substrate carrier along the first track or the second track.

7. The apparatus of claim 1, wherein the at least one first magnet device includes:
one or more first magnet units configured to generate a first magnetic field; and
one or more second magnet units configured to generate a second magnetic field different from the first magnetic field.

8. The apparatus of claim 7, wherein the apparatus is configured to adjust at least one magnetic field of the first magnetic field and the second magnetic field to provide the force acting on the substrate carrier.

9. The apparatus of claim 7, wherein the apparatus is configured to adjust at least one magnetic field of the first magnetic field and the second magnetic field to keep the substrate carrier at a predetermined distance from the at least one first magnet device.

10. The apparatus of claim 7, wherein the one or more first magnet units are permanent magnets and the one or more second magnet units are electromagnets, or wherein the one or more first magnet units are electromagnets and the one or more second magnet units are permanent magnets.

11. The apparatus of claim 10, wherein the apparatus is configured to change at least one magnetic field of the first magnetic field and the second magnetic field by activating or deactivating at least one electromagnet of the one or more first magnet units or the one or more second magnet units.

12. The apparatus of claim 1, further comprising at least one second magnet device configured to provide a magnetic force acting on the substrate carrier to contactlessly move the substrate carrier from the one or more second positions to the first position.

13. The apparatus of claim 1, wherein the first track and the second track are provided between the at least one first magnet device and the at least one second magnet device.

14. The apparatus of claim 1, further comprising a magnetic levitation system configured for a contactless levitation of the substrate carrier in the vacuum chamber.

15. The apparatus of claim 1, wherein the at least one first magnet device is moveable towards the one or more second positions to contactlessly move the substrate carrier from the first position to the one or more second positions.

16. The apparatus of claim 1, wherein the substrate carrier is positioned at a point of equilibrium of a magnetic field generated by the at least one first magnet device during the moving from the first position to the one or more second positions.

17. The apparatus of claim 1, wherein the substrate carrier is positioned at a point of equilibrium of a magnetic field generated by the at least one first magnet device during the moving from the first position to the one or more second positions.

18. System for vacuum processing of a substrate, comprising:
- a vacuum chamber;
- an apparatus for transportation of a substrate carrier in a vacuum chamber, comprising:
  - a first track providing a first transportation path for the substrate carrier; and
  - a transfer device configured for contactlessly moving the substrate carrier from a first position on the first track to one or more second positions away from the first track,
  - wherein the one or more second positions include at least one of a position on a second track and a process position for processing of a substrate, and wherein the transfer device comprises:
  - at least one first magnet device configured to provide a magnetic force acting on the substrate carrier to contactlessly move the substrate carrier from the first position to the one or more second positions,
  - one or more processing tools are arranged along at least one of the first track and the second track, wherein the one or more processing tools are selected from the group consisting of sputter sources, surface treatment tools, heating devices, cleaning devices, etching tools, and any combination thereof.

19. A method for transportation of a substrate carrier in a vacuum chamber, comprising:
- providing, by at least one first magnet device, a repulsive magnetic force acting on the substrate carrier; and
- contactlessly moving the substrate carrier from a first position on a first track providing a first transportation path for the substrate carrier to a second position away from the first track using the at least one first magnet device movable towards the second position, wherein the second position is at least one of a position on a second track and a process position for processing of a substrate.

20. The method of claim 19, wherein at least one first magnet device is moveable towards the second position to contactlessly move the substrate carrier from the first position to the second position.

* * * * *

UNITED STATES PATENT AND TRADEMARK OFFICE
CERTIFICATE OF CORRECTION

PATENT NO. : 10,636,687 B2
APPLICATION NO. : 16/062596
DATED : April 28, 2020
INVENTOR(S) : Simon Lau et al.

Page 1 of 1

It is certified that error appears in the above-identified patent and that said Letters Patent is hereby corrected as shown below:

In the Specification

In Column 8, Line 16, delete "(0.73×0.92 m)," and insert -- (0.73 m×0.92 m), --, therefor.

In Column 19, Line 47, after "thereof" insert -- . --.

In the Claims

In Column 22, Line 48, in Claim 13, delete "claim 1," and insert -- claim 12, --, therefor.

Signed and Sealed this
Fourth Day of August, 2020

Andrei Iancu
*Director of the United States Patent and Trademark Office*